Sept. 6, 1966 W. R. HEATON 3,271,634

GLASS-ENCASED SEMICONDUCTOR

Filed Oct. 20, 1961

WILLIAM R. HEATON
INVENTOR.

BY John G. Graham

United States Patent Office 3,271,634

Patented Sept. 6, 1966

3,271,634
GLASS-ENCASED SEMICONDUCTOR

William R. Heaton, Richardson, Tex., assignor to Texas Instruments Incorporated, Dallas, Tex., a corporation of Delaware Filed Oct. 20, 1961, Ser. No. 146,590
4 Claims. (Cl. 317—234)

This invention relates to semiconductor devices and methods of fabrication thereof, and more particularly to a transistor assembly which is very small in size and which requires no metallic header and can member.

Transistors are ordinarily packaged by bonding the active element or semiconductor slice to a metallic header and sealing a metallic can over the header. Appropriate leads are connected to the header, or else through the header and to the semiconductor slice, while an inert gas is usually placed in the can prior to sealing. This method of fabrication is relatively expensive, due to the complexity of the fabrication technique and also due to the fact that the price of the header and can ordinarily is much more than the cost of the active element itself. Also, the size of the resultant package is many times larger than the size of the active element. This increase in physical dimensions results from the necessities of making the header and can large enough for ease in fabrication, handling and insulation.

Previously it has been attempted to eliminate the necessity for the header and can by encapsulating the wafer and portions of its leads in a material such as plastic or epoxy resin. The organic materials used in such techniques do not exhibit the proper temperature expansion coefficients to match those of the semiconductor material and leads, resulting in damage during hardening. Also, it has been difficult to provide a true hermetic seal with organic encapsulating materials and to avoid decomposition under high temperature operation.

As set forth in a copending application Serial No. 102,560, filed April 12, 1961, and assigned to the assignee of the present invention, the use of solder glass as an encapsulating material overcomes the difficulties encountered in utilizing organic materials, but problems remain when attempting to utilize such techniques in high-volume, mechanized production of transistors. It is difficult to form a bead of solder glass slurry around the transistor, and the completed devices are not uniform in size and shape.

It is therefore the principal object of this invention to provide a semiconductor device and fabrication techniques therefor which are inexpensive and result in a very small completed package. Another object is to provide a glass encapsulated transistor and a method of manufacture therefor which is adapted for high-volume, mechanized production. A further object is to provide a glass-encapsulated transistor which is uniform in external dimensions.

A semiconductor device constructed in accordance with this invention includes a suitable body of semiconductor material disposed within a shell of hard glass. Conductive leads extend into the shell and contact the appropriate regions of the semiconductor body. A casing of hard glass fills up the shell, provides a hermetic seal, holds the semiconductor body firmly in place, and acts as a heat conductor. The casing glass must have a thermal expansion coefficient matched with the shell glass, and the softening point of the former must be less than that of the latter. The exposed junctions of the semiconductor body must be protected by some means such as an oxide coating, and the material used for the conductive leads must be composed of a material which will not damage the semiconductor body at the temperature used to form the glass casing. In the fabrication process, it is seen that the shell acts as a mold for the casing material which must be in a fluid state when introduced so that it will completely enclose the semiconductor device without resort to excessive heating.

The novel features believed characteristic of this invention are set forth in the appended claims. The invention itself, however, as well as further objects and advantages thereof, may best be understood from the following description of an illustrative embodiment, when read in conjunction with the accompanying drawing, in which:

Figures 1, 2:
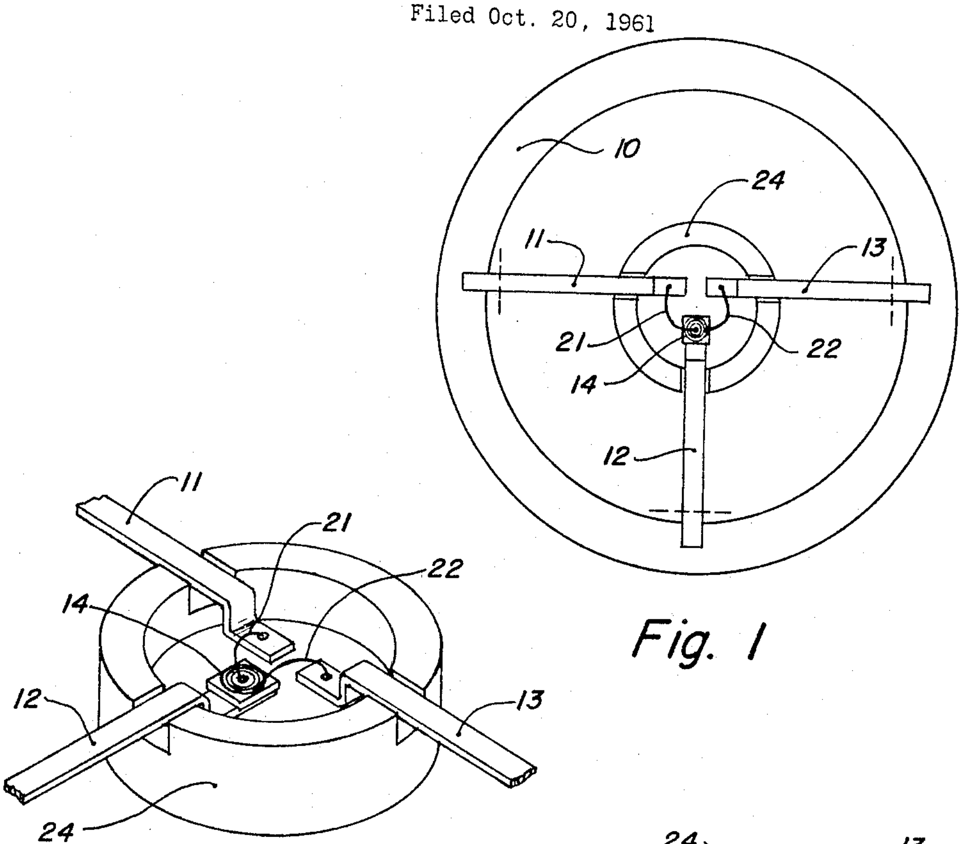
FIGURE 1 is the top view of the mounting frame and transistor assembly of this invention in an intermediate stage of fabrication.
FIGURE 2 is an enlarged pictorial view of the transistor assembly of FIGURE 1.
Figure 3:
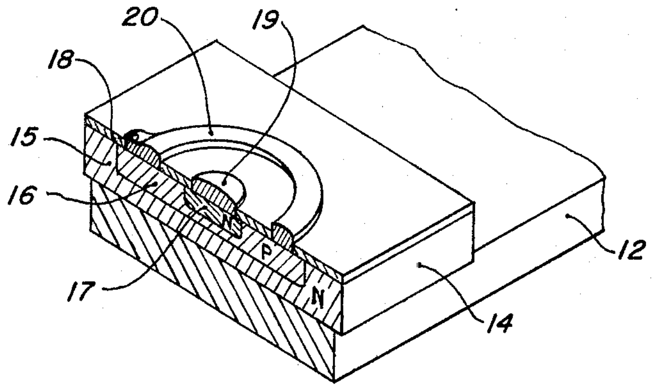
FIGURE 3 is a greatly enlarged pictorial view in section of the semiconductor wafer of FIGURE 1.

With reference to FIGURE 1, a transistor is fabricated according to this invention by first assembling the component parts on a mounting ring 10. This mounting ring is merely used in fabrication to hold the parts together, and so the specific form is immaterial. The ring 10 has three inwardly extending leads 11, 12 and 13 attached thereto by welding, for example, while the inner end of each of these leads is bent downwardly, as best seen in FIGURE 2. These leads may be composed of nickel clad on the top surface with about 1 mil thickness of silver. The dimensions of the leads are about 3 x 20 mil in cross section. A semiconductor wafer 14, having appropriate regions and junctions therein to form a planar silicon transistor, has been previously secured to the end of the lead 12. The wafer 14 may be bonded to the lead 12 by placing the lead on a strip heater and bringing it up to a temperature of approximately 830° C., the silver-silicon eutectic temperature, and then placing the wafer on the end of the lead. The lower, undiffused portion 15 of the wafer 14 (FIGURE 3) forms the collector region of the transistor so that the lead 12 provides the collector contact. A pair of diffused regions 16 and 17 have been formed in the wafer, as seen in FIGURE 3, and a silicon oxide layer 18 covers the top surface to protect the exposed edges of the junctions. Emitter and base contacts 19 and 20 have been provided by evaporating a conductive material such as aluminum onto the surface of the silicon wafer in areas where the oxide layer 18 has been selectively removed by etching. Although a planar type structure is illustrated wherein the exposed junctions are protected by an oxide coating, it is of course understood that other configurations can be used, and that the junctions could be protected by a surface treatment other than an oxide coating.

As seen in FIGURE 1, a small wire 21 is attached at one end to the emitter contact 19 by a technique such as ball bonding and attached at the other end to the lead 11 by spot welding, for example. In a like manner a small wire 22 is connected between the base contact 20 and the lead 13, the latter forming the base contact. Wires 21 and 22 are preferably silver, platinum or palladium with a diameter of about 1 mil.

The ring 10 including the transistor components is placed over a glass can or shell 24 which has been previously formed by pressing, extruding, or other suitable method. The inner ends of the leads 11, 12 and 13, which have been bent downwardly, are now seen to extend down into the shell. Depressions or notches around the edges of the shell 24 may be provided to accommodate the leads 11, 12 and 13. The shell 24 is composed of a hard glass material which is selected to have a temperature expansion coefficient matched with that of the solder glass potting material which is subsequently introduced. For example, a potash soda lead glass which is commercially available under the trade designation "Corning type 0120" may be used to form the shell 24. This glass has a thermal expansion coefficient of $89\times10^{-7}/°$ C. and a softening point of 630° C.

The device is now encapsulated by filling the shell 24 with a slurry prepared from finely ground solder glass, a solvent and perhaps a binder. The glass material must have a relatively low melting point, less than that of the shell 24 and less than that which would damage the semiconductor wafer, and may be of the type generally known as solder glass. Solder glasses are various combinations of inorganic materials including $SiO_2$, PbO, $Al_2O_3$, $B_2O_3$, ZnO and others. A material of this general type is commercially available under the trade designation of Corning Pyroceram, which incidentally includes traces of a material such as gold to aid in crystal formation upon fusing. Specifically, a glass matched with that suggested above would be high lead glass, Corning type 7570, which softens at 440° C. and has a temperature expansion coefficient of $84\times10^{-7}/°$ C. It is of course understood that any two types of glass could be used for the shell 24 and the casing, provided that the thermal expansion coefficients were matched with each other and that the softening points were adequately separated. The finely ground solder glass is mixed with a suitable amount of liquid solvent such as amylacetate to form a slurry of the proper viscosity so that the mixture flows into the shell and surrounds the transistor wafer and leads. The solvent may also include a small amount of binder such as nitrocellulose. The assembly is then allowed to stand in air for a time so that the solvent in the slurry may evaporate. The binder, if used, would aid in holding the powdered glass in place at this point. The powdered solder glass must then be fused to form a hard, impervious casing for the transistor device. If the solder glass has a softening point of about 440° C., as suggested above, then the device would be fired at a temperature of a few degrees above this point, or perhaps 450° to 500° C. During this firing, the nitrocellulose is burned out, if used, leaving only the glass. The time necessary to perform this firing step would vary, depending upon the materials used, but it has been found that about 30 minutes is adequate at 450° C.

Figure 4:
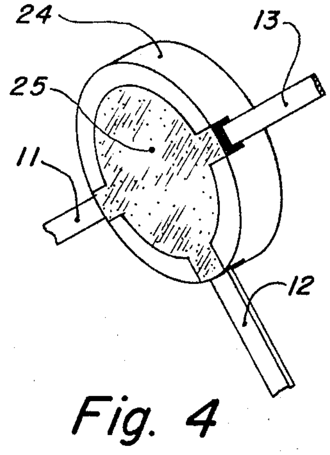
FIGURE 4 is a pictorial view of the completed assembly.

The device is then removed from the ring 10 by clipping the leads 11, 12 and 13 at the positions indicated in FIGURE 1 by dotted lines. The completed transistor assembly appears as in FIGURE 4, wherein the open side of the shell 24 is closed off by a casing 25 of hardened solder glass. The leads 11, 12 and 13 form the emitter, collector and base leads, respectively.

It should be emphasized that gold leads and contacts would not be very well adapted for use in the present transistor assemblies since gold and silicon form a eutectic at 377° C., well below the softening point of most solder glasses. The region wherein the gold-silicon eutectic forms might travel through the thin semiconductor wafer and destroy the junctions. Silver is well suited for use as the contact and lead material since a eutectic of silver and silicon forms at a relatively high temperature of 830° C. Likewise, platinum would be excellent lead material since a eutectic also forms between metallic compounds of platinum and silicon at 830° C. Palladium is also suitable for the leads since a eutectic of palladium and silicon compounds forms at 720° C.

It is, of course, understood that various configurations of the transistor assembly of this invention may be used in addition to the illustrative embodiment above. For example, instead of a three element transistor device, a two element diode or a multielement semiconductor network could be employed in place of the wafer 14. In this case, the number of leads or tabs utilized would correspond to the number of contacts necessary for the semiconductor device. Also, two transistors could be encapsulated in the same glass shell, in which case six tabs or leads would be arranged in a suitable configuration to extend into the shell and form base, emitter and collector contacts for both transistors. The shell could, of course, be of rectangular or any other suitable configuration.

Accordingly, even though the invention has been described with reference to a particular embodiment, this description is not meant to be construed in a limiting sense. Various modifications may be made by persons skilled in the art, as suggested above, and so it is contemplated that the appended claims will cover any such modifications as fall within the true scope of the invention.

What is claimed is:

1. A semiconductor device comprising a wafer of monocrystalline semiconductor material having regions of opposite conductivity types therein, a hard glass, cup-like shell composed of a glass having a given thermal expansion coefficient and a given softening point, a first conductive member extending through a notch in the vertical wall of said shell into the interior of said shell, said wafer being positioned on said first conductive member within said shell to provide electrical contact to said wafer in a region of one conductivity type, a second conductive member extending through a second notch in the vertical wall of said shell into the interior of said shell, a thin conductive lead connecting a region of said wafer at the opposite conductivity type to said second conductive member within the shell, and a casing of solder glass filling said shell and surrounding said wafer and the portions of said conductive members which are within the shell, said casing being composed of a fused glass powder having a softening point much lower than that of said shell and having a thermal expansion coefficient substantially equal to that of said shell.

2. The semiconductor device according to claim 1 wherein said wafer has a surface coating intermediate said wafer and said glass casing protecting the exposed edges at the junctions between said regions.

3. A semiconductor device comprising a wafer of monocrystalline semiconductor material having one region of a first conductivity type and two non-contiguous regions of a second conductivity type therein, a hard glass, cup-like shell composed of a glass having a given thermal expansion coefficient and a given softening point, a first conductive member extending through a notch in the vertical wall of said shell into the interior of said shell, said wafer being positioned on said first conductive member within said shell to provide electrical contact to said wafer in a first region of said second conductivity type, a second conductive member extending through a second notch in the vertical wall of said shell into the interior of said shell, a third conductive member extending through a third notch in the vertical wall of said shell into the interior of said shell, a first thin conductive lead connecting the region of said wafer of said first conductivity type to said second conductive member within the shell, a second thin conductive lead connecting a second region of said wafer of said second conductivity type to said third conductive member within the shell, and a casing of solder glass filling said shell and surrounding said wafer and the portions of said conductive members which are within the shell, said casing being composed of a fused glass powder having a softening point much lower than that of said shell and having a thermal expansion coefficient substantially equal to that of said shell.

4. A semiconductor device according to claim 3 wherein said wafer has a surface coating intermediate said wafer and said glass casing protecting the exposed edges of the junctions between said regions.

(References on following page)

References Cited by the Examiner

UNITED STATES PATENTS

| | | | |
|---|---|---|---|
| 2,694,168 | 11/1954 | North et al. | 317—236 |
| 2,773,158 | 12/1956 | Myers | 317—234 |
| 2,796,563 | 6/1957 | Ebers et al. | 317—235 |
| 2,817,046 | 12/1957 | Weiss | 317—234 |
| 2,853,662 | 9/1958 | Woods | 317—234 |
| 2,930,097 | 3/1960 | Iversen | 65—18 |
| 2,971,138 | 2/1961 | Meisel et al. | 317—235 |
| 3,030,562 | 4/1962 | Maiden et al. | 317—235 |
| 3,149,375 | 9/1964 | Gehl | 65—18 |

FOREIGN PATENTS

| | | |
|---|---|---|
| 625,466 | 6/1949 | Great Britain. |

JOHN W. HUCKERT, *Primary Examiner.*

E. PUGH, J. D. CRAIG, J. D. KALLAM, *Assistant Examiners.*